(12) United States Patent
Tessnow

(10) Patent No.: US 10,670,351 B2
(45) Date of Patent: Jun. 2, 2020

(54) TWO PIECE ALUMINUM HEAT SINK

(71) Applicant: Thomas Tessnow, Weare, NH (US)

(72) Inventor: Thomas Tessnow, Weare, NH (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 378 days.

(21) Appl. No.: 15/097,483

(22) Filed: Apr. 13, 2016

(65) Prior Publication Data

US 2016/0252312 A1    Sep. 1, 2016

Related U.S. Application Data

(63) Continuation of application No. 13/894,712, filed on May 15, 2013.

(51) Int. Cl.

| F28F 7/00 | (2006.01) |
| F28F 21/08 | (2006.01) |
| F28F 13/00 | (2006.01) |
| H01L 23/367 | (2006.01) |
| H01L 33/64 | (2010.01) |
| F21V 29/76 | (2015.01) |
| F28F 3/02 | (2006.01) |
| F28D 21/00 | (2006.01) |
| H01L 21/48 | (2006.01) |
| H01L 23/373 | (2006.01) |
| F21Y 101/00 | (2016.01) |

(52) U.S. Cl.
CPC ............ *F28F 21/084* (2013.01); *F21V 29/76* (2015.01); *F28F 3/02* (2013.01); *F28F 13/00* (2013.01); *H01L 23/367* (2013.01); *H01L 33/641* (2013.01); *F21Y 2101/00* (2013.01); *F28D 2021/0029* (2013.01); *F28F 2013/001* (2013.01); *F28F 2255/146* (2013.01); *F28F 2255/16* (2013.01); *H01L 21/4871* (2013.01); *H01L 21/4882* (2013.01); *H01L 23/3735* (2013.01); *H01L 23/3736* (2013.01); *H01L 33/642* (2013.01); *H01L 2924/0002* (2013.01); *H01L 2933/0075* (2013.01)

(58) Field of Classification Search
CPC .. F21V 19/005; F21V 19/0065; F21V 29/004; F21V 13/04; F21V 29/76; B23K 1/0008; F28F 21/084; F28F 3/02; F28F 13/00; H01L 23/367; H01L 33/641
USPC ....................................................... 165/80.3
See application file for complete search history.

(56) References Cited

U.S. PATENT DOCUMENTS

| 4,841,422 A * | 6/1989 | Groh ................... F21V 19/0005 362/294 |
| 6,257,327 B1 | 6/2001 | Rembold et al. |
| 6,367,152 B1 | 4/2002 | Kataoka |
| 6,483,169 B1 | 11/2002 | Tosaya et al. |

(Continued)

*Primary Examiner* — Davis D Hwu
(74) *Attorney, Agent, or Firm* — Edward Podszus

(57) ABSTRACT

A heat sink includes an extruded component, a cast component, and an interface layer. The extruded component includes a first aluminum material and is configured to be coupled to a solid state light source. The cast component includes a second aluminum material overmolded onto a portion of the extruded component to form the interface layer. The interface layer is formed of at least one of the first and the second aluminum materials and abuts against and couples the extruded component to the cast component.

9 Claims, 5 Drawing Sheets

(56) References Cited

U.S. PATENT DOCUMENTS

| | | | |
|---|---|---|---|
| 6,974,233 B1 * | 12/2005 | Aubrey | F21V 19/0065 362/294 |
| 7,311,140 B2 | 12/2007 | McCullough | |
| 7,367,382 B2 | 5/2008 | Miyazawa et al. | |
| 7,484,863 B1 * | 2/2009 | Aubrey | F21V 13/04 362/294 |
| 7,592,695 B2 | 9/2009 | Reis et al. | |
| 9,108,261 B1 * | 8/2015 | Patrick | B23K 1/0008 |
| 2002/0195229 A1 | 12/2002 | Hsieh et al. | |
| 2003/0051867 A1 | 3/2003 | Kennedy | |
| 2003/0188848 A1 | 10/2003 | Kuo | |
| 2004/0040327 A1 | 3/2004 | Iida | |
| 2005/0145367 A1 | 7/2005 | Hannah et al. | |
| 2009/0002946 A1 | 1/2009 | Horng et al. | |
| 2009/0116195 A1 | 5/2009 | Yang et al. | |
| 2009/0178782 A1 | 7/2009 | Guyon et al. | |
| 2009/0308584 A1 | 12/2009 | Yang | |
| 2010/0200208 A1 | 8/2010 | Cola et al. | |
| 2011/0090686 A1 | 4/2011 | Pickard | |
| 2011/0103016 A1 | 5/2011 | Tang et al. | |
| 2011/0149537 A1 | 6/2011 | Kurosawa | |
| 2011/0206969 A1 | 8/2011 | Tennessen et al. | |
| 2011/0259570 A1 | 10/2011 | Suzuki | |
| 2011/0310559 A1 | 12/2011 | Horng et al. | |
| 2012/0170262 A1 * | 7/2012 | Hoetzl | F21V 29/004 362/227 |
| 2013/0088890 A1 * | 4/2013 | Knapp | G09F 13/22 362/609 |
| 2014/0177947 A1 | 9/2014 | Krassowski et al. | |

\* cited by examiner

TWO PIECE ALUMINUM HEAT SINK

CROSS REFERENCE TO RELATED APPLICATIONS

This application is a continuation of, and claims priority under 35 U.S.C. § 120 from, Applicant's pending parent application U.S. Ser. No. 13/894,712, on appeal.

TECHNICAL FIELD

The present disclosure relates to heat sinks for solid state illumination systems, and more particularly pertains to two-component aluminum alloy heat sinks.

BACKGROUND

While solid state light sources (e.g., light emitting diodes, LEDs) may generate less thermal energy compared to traditional bulbs (e.g., incandescent light bulbs), solid state light sources nevertheless generate thermal energy which should be managed in order to control the junction temperature. A higher junction temperature generally correlates to lower light output, lower luminaire efficiency, and/or reduced life expectancy.

Many solid state illumination systems include heat sinks designed to dissipate thermal energy away from the solid state light source in order to manage the junction temperature. Examples of heat sinks include, for example, U.S. Pat. No. 7,592,695 (Reis et al.), U.S. Pat. No. 6,367,152 (Kataoka), U.S. Pat. No. 7,311,140 (McCullough), and U.S. Patent Pub. No. 2001/0259570 (Suzuki). Heat sinks also exist that include a copper insert coupled to an aluminum portion. The copper insert may be bolted onto the aluminum portion. A thermal paste is believed to be required to fill in the microscopic gaps between the copper and the aluminum portions, thereby creating an additional thermal interface. Copper/aluminum heat sinks also exist which include a copper insert that appears to be seamlessly coupled to an aluminum portion.

BRIEF DESCRIPTION OF THE DRAWINGS

Features and advantage of the claimed subject matter will be apparent from the following description of embodiments consistent therewith, which description should be considered in conjunction with the accompanying drawings, wherein:

DETAILED DESCRIPTION

Figure 1:
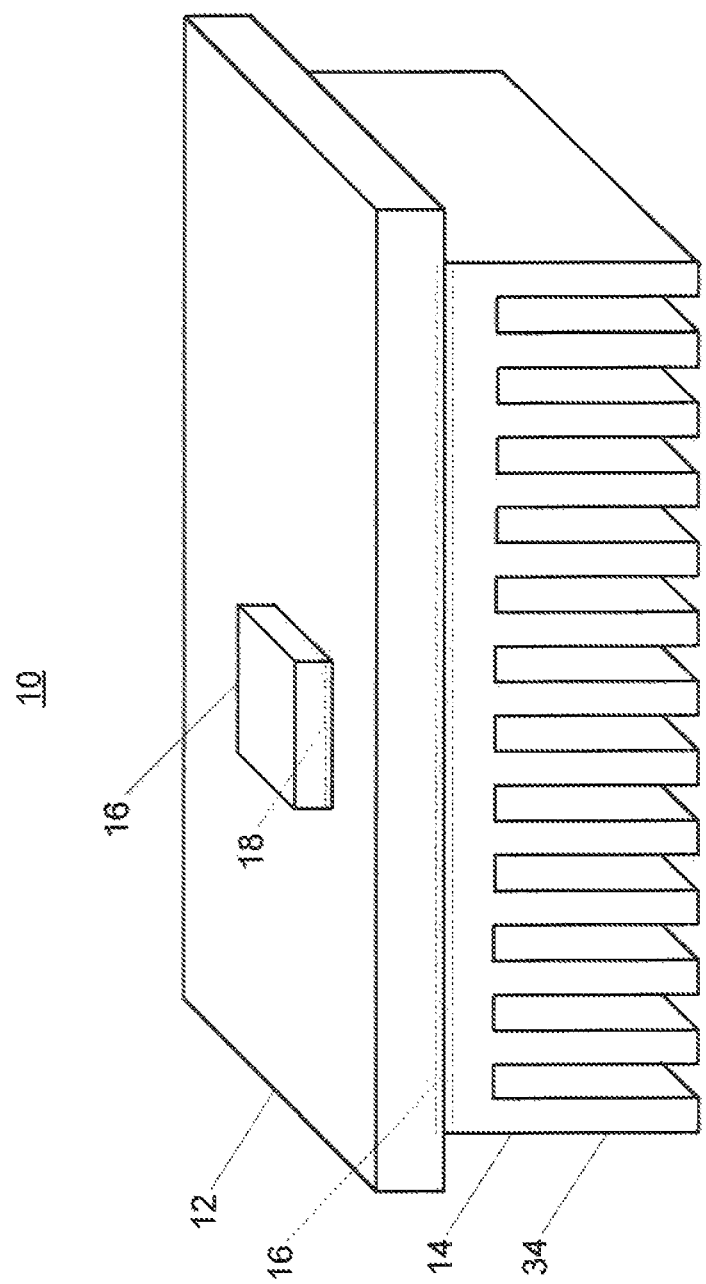
FIG. 1 illustrates one embodiment of heat sink consistent with the present disclosure.

By way of an overview, one aspect consistent with the present disclosure features a heat sink including a cast component overmolded onto a portion of an extruded component. The extruded component includes a first aluminum material and is configured to be coupled to a solid state light source. The cast component includes a second aluminum material which is overmolded onto a portion of the extruded component to form an interface layer. The interface layer is formed of at least one of the first and the second aluminum materials, and abuts against and couples the extruded component with the cast component.

The heat sink of the present disclosure provides numerous benefits and solves several problems. For example, while cast aluminum heat sinks are inexpensive and allow complex heat sink shapes, cast aluminum has a low thermal conductivity (e.g., about 90 W/mK) which may not be able to transfer enough thermal energy away from the solid state light source to maintain the desired, junction temperature. Additionally, the low thermal conductivity of cast aluminum may require the cast aluminum heat to be unacceptably bulky and/or heavy. While extruded aluminum heat sinks have substantially higher thermal conductivity compared to cast aluminum heat sink (e.g., about 200 W/mK), extruded aluminum heat sinks suffer from limited design flexibility. For example, the shape of extruded aluminum heat sinks is generally limited to a symmetric shape unless post-extrusion machining (e.g., to include mounting holes and/or irregular shapes) is utilized. Unfortunately, the post-extrusion machining adds significant costs to the heat sink and also limits high volume production.

While it is also possible to combine cast aluminum with other materials having higher thermal conductivity, (e.g., copper), this combination also suffers from several disadvantages which the heat sink of the present disclosure solves. For example, cast aluminum and copper have different, electrode potentials, and as a result, suffer from galvanic corrosion. Additionally, copper is very expensive compared to aluminum, thereby adding to the overall cost of the heat sink. Moreover, cupper has a melting temperature of approximately 1084° C., whereas, aluminum alloys have a melting temperature in the range of about 463-671° C. Additionally, copper is very soluble in molten aluminum. The lower melting temperature of the aluminum alloys and the solubility of copper in molten aluminum may complicate the manufacturing process of the heat sink. Moreover, the resulting Al—Cu alloy is very brittle (e.g., one of reasons aluminum is not used as a brazing filler metal for copper), and therefore the bonding between the two components is not very robust and may be prone to failure. Additionally, the Al—Gu alloy has relatively low thermal conductivity (e.g., approximately ½ to ¹/₁₀ the conductivity of the aluminum alone based on the thermal conductivity of different bronzes), and as a result, the thermal transfer from the copper component to the cast aluminum component may be significantly reduced.

The heat sink of the present disclosure solves the disadvantages and limitations discussed above. The extruded aluminum component (and its relatively high thermal conductivity) is able to effectively and efficiently spread the thermal energy of the solid state light source across the heat sink to the cast aluminum component. The cast aluminum component may also be easily and inexpensively manufactured into complicated shapes (e.g., including mounting, holes and irregular shapes), thereby allowing the heat sink to have increased design flexibility for a variety of different applications. The extruded and cast aluminum components have substantially similar electrode potentials, and as a result, galvanic corrosion is significantly reduced and/or eliminated. Moreover, extruded and cast aluminum are both relatively inexpensive, and expensive post-manufacture machining may be eliminated because of the casting process, thereby further reducing the manufacturing cost of the heat sink.

There has been a belief that the similar melting temperatures of extruded aluminum and cast aluminum create manufacturing problems. However, the inventor of the present disclosure has recognized that the instead of creating problems, the similar melting temperatures may create benefit if the temperature of the extruded component is monitored during the overmolding process. In particular, the similar melting temperatures of the extruded aluminum and cast aluminum as well as optionally cooling of the extruded component during the overmolding process allows for the formation of an interface layer during the overmolding of the cast aluminum over a portion of the extruded aluminum while also maintaining the grain structure (and the high thermal conductivity of the extruded aluminum). The interface layer enhances the bonding between the extruded component and the cast aluminum, thereby eliminating the need for fasteners, and also enhancing the thermal transfer between the extruded component and the cast component.

Turning now to FIG. 1, one embodiment of a heat sink 10 consistent with the present disclosure is generally illustrated. The heat sink 10 includes an extruded component 12 and a cast component 14 which is overmolded onto a portion of the extruded component 12 to form an interface layer 16. The extruded component 12 includes a first aluminum material and is configured to be coupled to one or more solid state light sources 18, such a light emitting diode (LED). The solid state light source 18 may be secured to an exposed surface of the extruded component 12. For example, the solid state light source 18 may be secured directly to and abut against the exposed surface of the extruded portion 12. Alternatively, a thermal interface material 20 may be disposed between the solid state light source 18 and the extruded component 12. The thermal interface material 20 may increase the thermal conductivity between the solid state light source 18 and the extruded component 12 by filling microscopic air-gaps present due to the imperfectly flat and smooth surfaces of the solid state light source 18 and the extruded component 12. The thermal interface material 20 may include, but is not limited to, thermal greases and/or thermal interface pads.

The extruded component 12 is formed from a first aluminum material which includes any aluminum alloy that can be extruded. The cast component 14 is formed from a second aluminum material which includes any aluminum alloy which can be cast onto a portion of the extruded component 12. The second aluminum material may be the same as or different than the first aluminum material. Examples of the first and/or second aluminum materials may include, but are not limited to, AA 6061 (as designated by the Aluminum Association), AA 6063, or the like. Of course, these are just examples, and the present disclosure is not limited to any particular aluminum material unless specifically claimed as such. The use of aluminum materials for both the extruded component 12 and the cast component 14 allows the heat sink 10 of the present disclosure to be manufactured inexpensively compared to other heat sink designs while still allowing the heat sink 10 to dissipate enough heat for use in high-power solid state lighting applications with limited space and/or weight constraints.

The cast component 14 will have a lower thermal conductivity compared to the extruded component 12, even in the case where the first and second aluminum materials are the same, due to the casting process versus the extrusion process. In particular, the cast component 14 is less dense and more porous compared to the extruded component 12. For example, second aluminum material of the cast component 14 may have a thermal conductivity between than 80 W/mK and 150 W/mK (e.g., 90 W/mK) whereas the first aluminum material of the extruded component 12 may have a thermal conductivity greater than 160 W/mK, for example, greater than 200 W/mK such 209 W/mK. As discussed herein, the extruded aluminum component 12 may compensate for the lower thermal conductivity of the cast aluminum component 14 by spreading the thermal energy more efficiently to the cast aluminum component 14. As a result, the heat sink 10 according to the present disclosure is capable of being transferring enough thermal energy to maintain a desired junction temperature even high-power solid state light source applications, without being undesirably heavy and/or bulky.

The first and second aluminum materials may be selected to have substantially similar electrode potentials (e.g., but not limited to, materials have electrode potentials which are less than 10% of each other). One benefit of selecting the first and second aluminum materials to have substantially similar electrode potentials is that is eliminates and/or significantly reduces galvanic corrosion between the extruded component 12 and the cast component 14. This may be accomplished by selecting the same aluminum material for the extruded component 12 and the cast component 14.

As noted above, the heat sink 10 also includes an interface layer 16. As used herein, the interface layer 16 is defined as a portion of the extruded component 12 which at least partially melts and bonds with a portion of the cast component 14 when the extruded component 12 is in contact with the liquid second aluminum material during the overmolding of the cast component 14 onto a portion of the extruded component 12. The interface layer 16 may therefore have a grain structure which is different than the grain structure of extruded component 12 and/or the cast component 14. The interface layer 16 may have a cross-sectional thickness sufficient to bond together the extruded component 12 and the cast component 14. For example, the interface layer 16 may have a cross-sectional thickness in the range of about 3 µm to about 5 mm. The interface layer 16 enhances the bonding between the extruded component 12 and the cast aluminum component 14, thereby eliminating the need for fasteners, to couple the extruded component 12 and the cast aluminum component 14. Additionally, the interface layer 16 also enhancing the thermal transfer between the extruded component and the cast component by reducing and/or eliminating any gaps between the components 12, 14. As a result, the heat sink 10 does not require any thermal interface materials between the extruded component 12 and the cast aluminum component 14, thereby further reducing the manufacturing costs and decreasing the manufacturing time.

Figure 3:
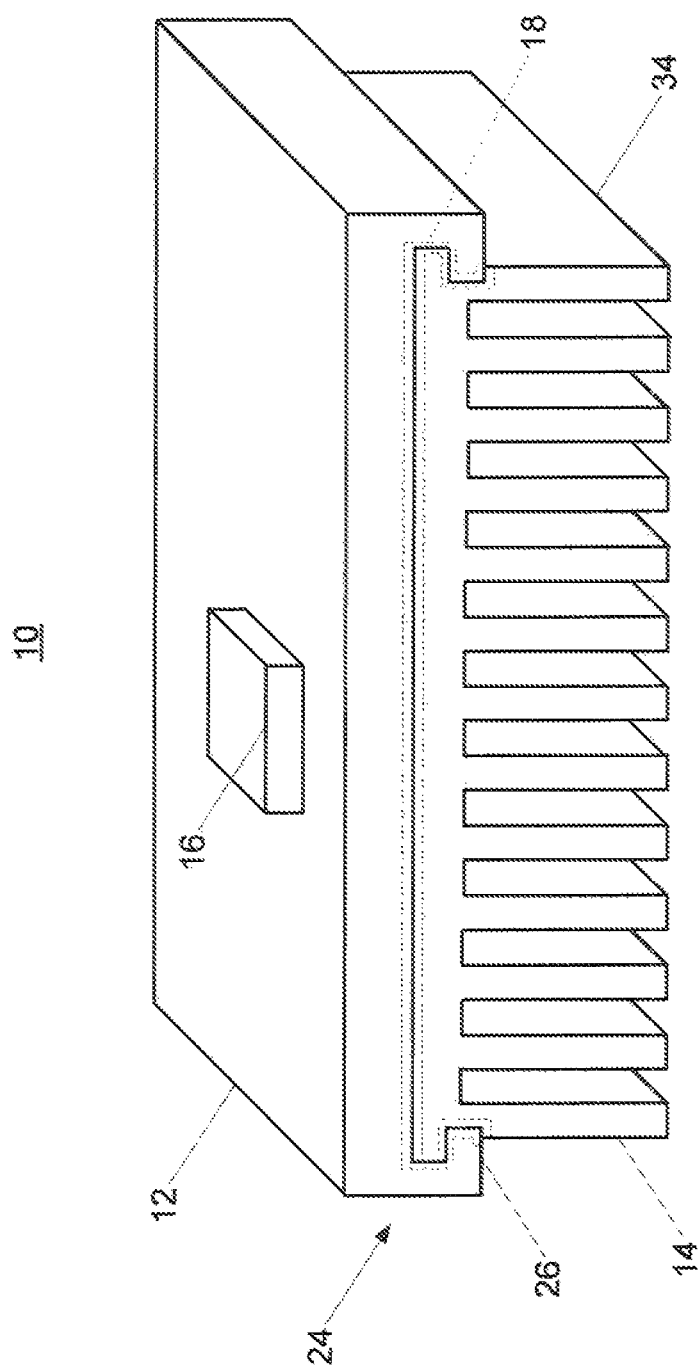
FIG. 3 illustrates a yet another embodiment of a heat sink consistent with the present disclosure having mounting features.
Figure 4:
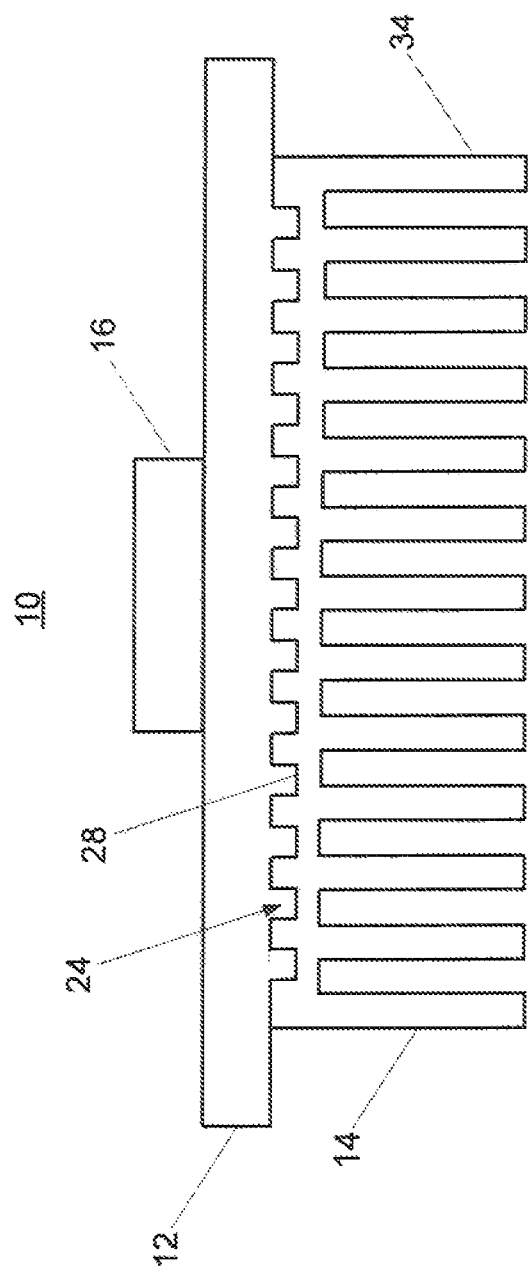
FIG. 4 illustrates a yet a further embodiment of a heat sink consistent with the present disclosure having mounting features.

The extruded component 12 may have any profile which can be extruded. For examples, the extruded component 12 may have the same cross-sectional profile along at least one dimension (e.g. the same cross-sectional profile along the length). For example, the extruded component 12 may optionally include one or more fins 22 (FIG. 2) extending outward to increase the surface area of the heal sink 10 to dissipate thermal energy. The extruded component 12 may also optionally include continuous surfaces (e.g., the extruded component 12 does not have any apertures). The extruded component 12 may also include at least one molding feature 24, FIGS. 3 and 4, configured to increase the mechanical connection between the extruded component 12 and the cast component 14. The molding feature 24 may at least partially melts during the overmolding of the cast component 14 to form a portion of the interface layer 16. For example, the molding feature 24 may include one or more hooks or lips 26 (FIG. 3) and/or one or more ribs, protrusions, or the like 28 (FIG. 4).

Figure 2:
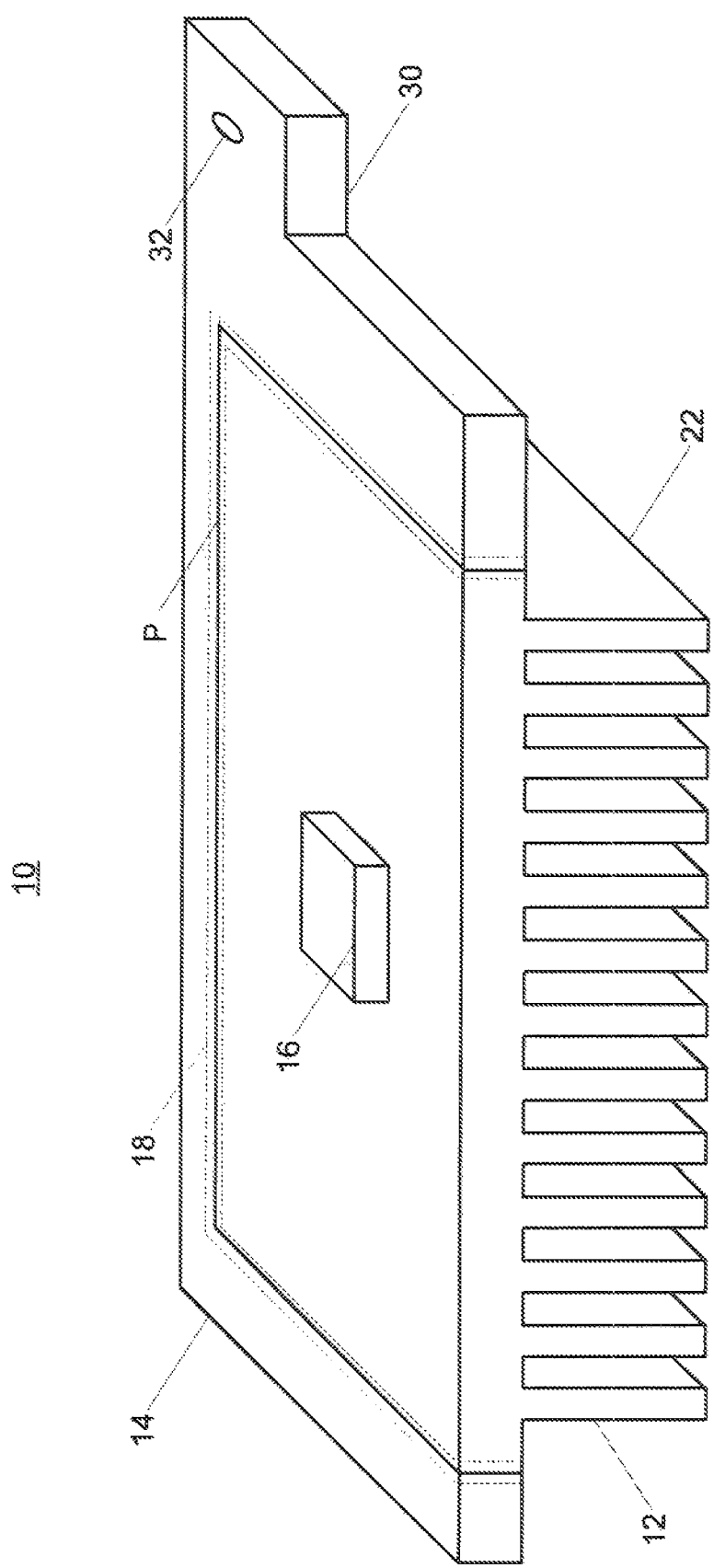
FIG. 2 illustrates another embodiment of heat sink consistent with the present disclosure having a mounting tab, mounting aperture, and an extruded component with fins.

The cast component 14 may include any shape such as, but not limited to, non-symmetrical shapes and/or complex shapes. For example, as generally illustrated in FIG. 2, the cast component 14 may include mounting tabs 30 and/or mounting apertures 32. The cast component 14 may also include at least one fin 34 extending outward to increase the surface area of the heat sink 10 to dissipate thermal energy. With reference to FIG. 1, the cast component 14 may be coupled to the extruded component 12 on a surface generally opposite to the solid state light source 18. Alternatively (or in addition), the cast component 14 may be coupled to at least a portion of the perimeter P of the extruded component 12 which generally circumscribes the solid state light source 18 as generally illustrated in FIG. 2.

As noted above, the extruded component 12 may be formed and the cast component 14 may thereafter be overmolded onto a portion of the extruded component 12. There has been a belief that the similar melting temperatures of extruded aluminum and cast aluminum create manufacturing problems. However, the inventor of the present disclosure has recognized that the instead of creating problems, the similar melting temperatures may create benefit if the extruded component 12 is sufficiently cooled during the overmolding process. In particular, the similar melting temperatures of the extruded aluminum and cast aluminum as well as the cooling of the extruded component 12 during the overmolding process allows for the formation of the interface layer 16 during the overmolding of the cast aluminum 14 over a portion of the extruded aluminum component 12 while also maintaining the grain structure (and the high thermal conductivity) of the extruded aluminum component 12. The interface layer 16 enhances the bonding between the extruded component 12 and the cast aluminum component 14, thereby eliminating the need for fasteners, and also enhancing the thermal transfer between the extruded component 12 and the cast component 14.

Figure 5:
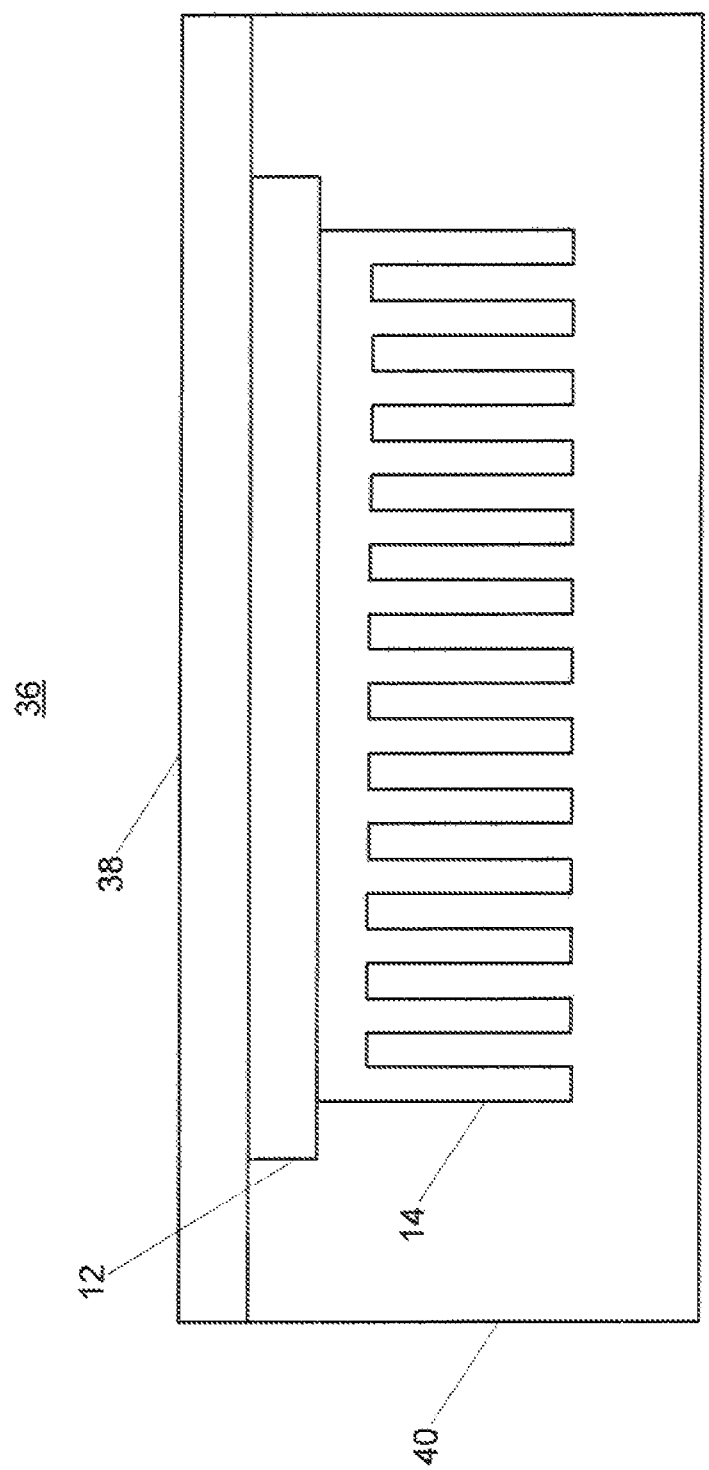
FIG. 5 illustrates one embodiment of a mold for forming a heat sink consistent with the present disclosure.

After the extruded component 12 is formed, the extruded component 12 may be loaded into a mold 36 as generally illustrated in FIG. 5 and the cast component 14 may thereafter be overmolded onto a portion of the extruded component 12 to form the interface layer 16. While is it desirable for a portion of the extruded component 12 to melt during the overmolding of the cast component 14 to form the interface layer 16 and create a bond therebetween, the first and second aluminum materials may have very similar melting points and care should be taken to avoid melting too much of the extruded component 12 during the overmolding of the cast component 14, otherwise the thermal conductivity of the extruded component 12 may reduced. Consequently, it may be desirable to cool a portion 38 of the mold 36 which contacts the extruded component 12 to avoid melting too much of the extruded component 12. The amount which the extruded component 12 should be cooled will depend on many factors such as, but not limited to, the cross-sectional thickness of the extruded component 12, the amount of time that the extruded component 12 is disposed within the mold 36, the temperature of the liquid second aluminum material during the overmolding process, and/or the temperature of the hot side 40 of the mold 36. For exemplary purposes only, a heat sink 10 having an extruded component 12 which is 1 inch (2.54 cm) thick may be cooled such that the surface which contacts the second aluminum material is approximately 20 to 50° C. below the melting temperature of the first aluminum material.

According to one aspect, the present disclosure features a heat sink including an extended component, a cast component, and an interface layer. The extruded component includes a first aluminum material and is configured to be coupled to a solid state light source. The cast component includes a second aluminum material overmolded onto a portion of the extruded component to form the interface layer. The interface layer is formed of at least one of the first and the second aluminum materials and abuts against and couples the extruded component to the cast component.

While the principles of the present disclosure have been described herein, it is to be understood by those skilled in the art that this description is made only by way of example and not as a limitation as to the scope of the invention. The features and aspects described with reference to particular embodiments disclosed herein are susceptible to combination and/or application with various other embodiments described herein. Such combinations and/or applications of such described features and aspects to such other embodiments are contemplated herein. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

THE FOLLOWING IS A LIST OF REFERENCE NUMERAL USED IN THE SPECIFICATION:

10 heat sink
12 extruded component
14 cast component
16 interface layer
18 solid state light source
20 thermal interface material
22 fins
24 molding feature
26 hooks, lips
28 ribs, protrusions
30 mounting tabs
32 mounting apertures
34 fin
36 mold
38 cooled side of mold
40 hot side of mold
P perimeter

What is claimed is:

1. A heat sink (10) comprising:
   an extruded component (12) comprising a first aluminum material, said extruded component (12) comprising an exposed surface configured to be coupled to a solid state light source (16), said extruded component (12) further comprising heat dissipation elements (22) extending away from said exposed surface; and
   a cast component (14) having an upper surface and a lower surface and an aperture extending between said upper and lower surfaces, wherein said exposed surface of said extruded component (12) extends into said aperture.

2. The heat sink of claim 1, wherein said cast component (14) surrounds said exposed surface of said extruded component (12) on at least three sides.

3. The heat sink of claim 1, wherein said cast component (14) comprises a second aluminum material overmolded onto a portion of said extruded component (12) to form an interface layer (18), wherein said interface layer (18) is formed of at least one of said first and said second aluminum materials, said interface layer (18) abutting against and coupling said extruded component (12) to said cast component (14).

4. The heat sink of claim 1, further comprising said solid state light source (16), wherein said solid state light source (16) is secured to an exposed surface of said extruded component (12).

5. The heat sink of claim 4, wherein said solid state light source (16) is secured directly to and abuts against said extruded component (12).

6. The heat sink of claim 4, further comprising a thermal interface material (20) disposed between said solid state light source (18) and said extruded component (12).

7. The heat sink of claim 1, wherein said upper surface faces opposite said lower surface, said aperture extends from said upper surface to said lower surface, and said exposed surface of said extruded component (12) extends in said aperture over an axial extent of said aperture from said lower surface to said upper surface.

8. The heat sink of claim 1, wherein said extruded component (12) comprises an extruded base portion and a plurality of extruded ribs integrally formed with the extruded base portion, said extruded base portion defining said exposed surface and said extruded ribs defining said heat dissipation elements (22).

9. A heat sink (10) comprising:
an extruded component (12) comprising a first aluminum material, said extruded component (12) comprising an exposed surface configured to be coupled to a solid state light source (16), said extruded component (12) further comprising heat dissipation elements (22) extending away from said exposed surface; and
a cast component (14) having an upper surface and a lower surface and an aperture extending between said upper and lower surfaces, wherein said exposed surface of said extruded component (12) extends into said aperture;
wherein said cast component (14) comprises a second aluminum material overmolded onto a portion of said extruded component (12) to form an interface layer (18), wherein said interface layer (18) is formed of at least one of said first and said second aluminum materials, said interface layer (18) abutting against and coupling said extruded component (12) to said cast component (14).

* * * * *